United States Patent
Elhakiki et al.

(10) Patent No.: US 8,941,451 B2
(45) Date of Patent: Jan. 27, 2015

(54) BROADBAND SAW FILTER

(75) Inventors: Mohamed Elhakiki, Valbonne (FR);
Heiko Hartmann, Unterhaching (DE);
Jacques Antoine Damy, Nice (FR)

(73) Assignee: EPCOS AG, Munich (DE)

( * ) Notice: Subject to any disclaimer, the term of this patent is extended or adjusted under 35 U.S.C. 154(b) by 50 days.

(21) Appl. No.: 13/992,160

(22) PCT Filed: Feb. 4, 2011

(86) PCT No.: PCT/EP2011/051670
§ 371 (c)(1),
(2), (4) Date: Aug. 14, 2013

(87) PCT Pub. No.: WO2012/103958
PCT Pub. Date: Aug. 9, 2012

(65) Prior Publication Data
US 2013/0321103 A1      Dec. 5, 2013

(51) Int. Cl.
*H03H 9/00*  (2006.01)
*H03H 9/64*  (2006.01)
*H03H 9/02*  (2006.01)
*H03H 9/145* (2006.01)

(52) U.S. Cl.
CPC ............... *H03H 9/64* (2013.01); *H03H 9/0222* (2013.01); *H03H 9/02779* (2013.01); *H03H 9/14505* (2013.01); *H03H 9/14558* (2013.01)
USPC .......................................... 333/193; 310/311

(58) Field of Classification Search
USPC .......................................... 333/193; 310/311
See application file for complete search history.

(56) References Cited

U.S. PATENT DOCUMENTS

| | | | |
|---|---|---|---|
| 5,831,492 A | 11/1998 | Solie | |
| 6,023,122 A | 2/2000 | Liu et al. | |
| 6,037,847 A | 3/2000 | Ueda et al. | |
| 6,317,015 B1 | 11/2001 | Ueda et al. | |
| 7,939,988 B2 | 5/2011 | Goto et al. | |
| 8,207,800 B2 | 6/2012 | Tsuda | |
| 2004/0246076 A1 | 12/2004 | Bergmann | |
| 2006/0273868 A1* | 12/2006 | Ebner | 333/193 |
| 2009/0167462 A1* | 7/2009 | Bergmann | 333/193 |
| 2010/0102901 A1 | 4/2010 | Tsuda | |
| 2011/0084780 A1* | 4/2011 | Damy et al. | 333/196 |
| 2013/0257220 A1* | 10/2013 | Martin et al. | 310/313 B |
| 2013/0321103 A1* | 12/2013 | Elhakiki et al. | 333/193 |

FOREIGN PATENT DOCUMENTS

| | | |
|---|---|---|
| DE | 10314153 A1 | 10/2004 |
| DE | 102005009359 A1 | 9/2006 |
| EP | 2 180 597 A1 | 4/2010 |
| JP | 8316781 A | 11/1996 |
| JP | 9167936 A | 6/1997 |
| JP | 11500593 A | 1/1999 |
| JP | 200091869 A | 3/2000 |
| JP | 2009284474 A | 12/2009 |
| JP | 2010103849 A | 5/2010 |
| JP | 2010239511 A | 10/2010 |

* cited by examiner

*Primary Examiner* — Adam Houston
(74) *Attorney, Agent, or Firm* — Slater & Matsil, L.L.P.

(57) ABSTRACT

A new type of very broad bandwidth filters with small insertion loss and high return loss are given. The new filter uses a substrate that can propagate a PSAW and fan shaped transducers of low metallisation height, high metallisation ratio, low reflectivity and high coupling coefficient.

16 Claims, 6 Drawing Sheets

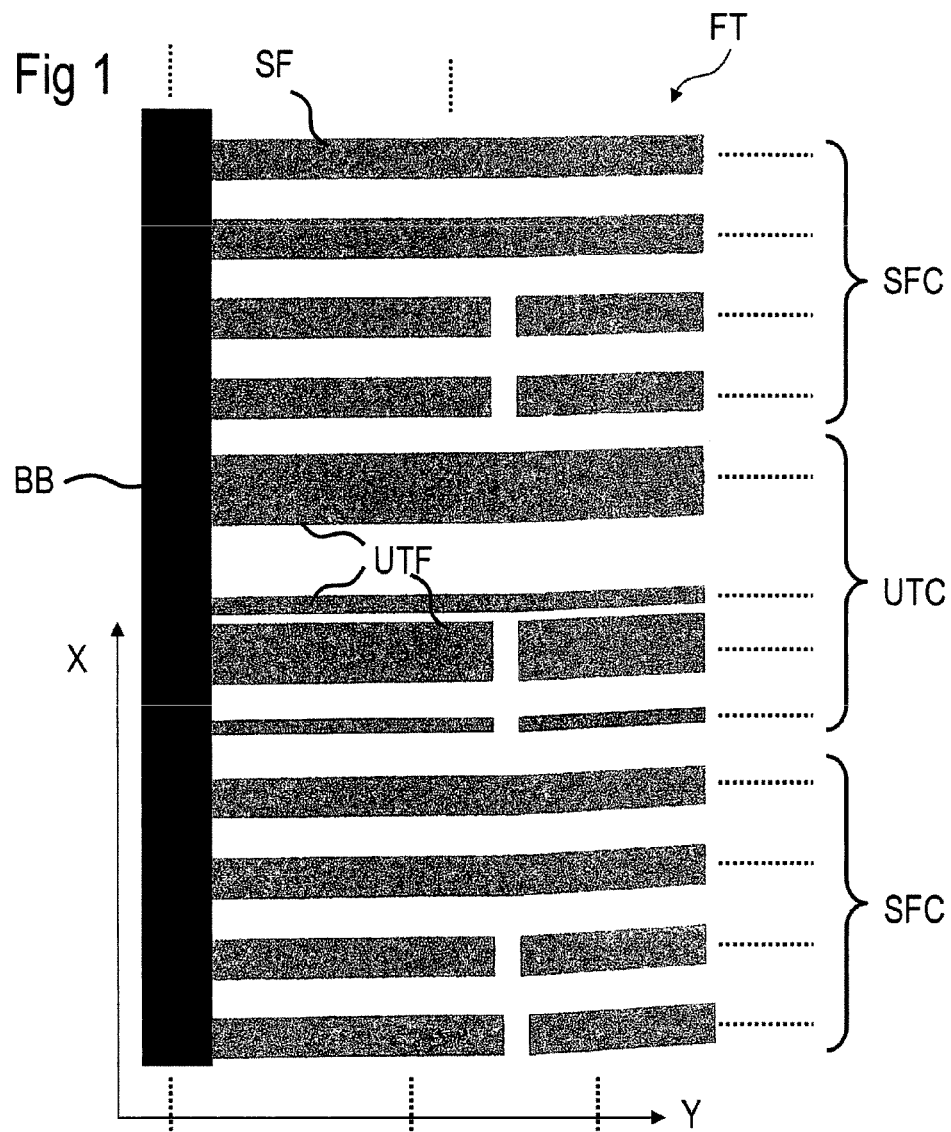
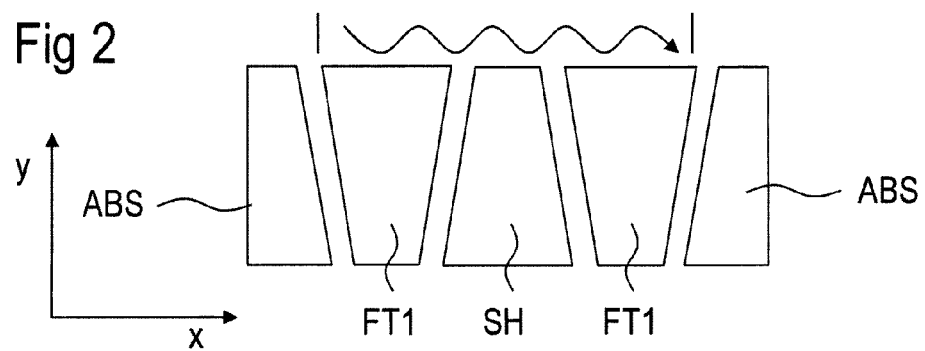

FT1

SH

BROADBAND SAW FILTER

This patent application is a national phase filing under section 371 of PCT/EP2011/051670, filed Feb. 4, 2011, which is incorporated herein by reference in its entirety.

TECHNICAL FIELD

The application refers to broadband SAW filters (SAW=surface acoustic wave) that are useful for mobile communication in mobile phones, wireless terminals or base stations.

BACKGROUND

There have been made some attempts to provide filters having a very large relative bandwidth of say about 8% or more. Ceramic filters, for example, are used for very large bandwidth filters with low losses but they are very expensive. Further, the steepness of the skirts of the transmission bands is poor in view of SAW filters.

Commonly used SAW filters work with Raleigh waves. But this type of SAW waves does show only small coupling and hence, results in wide band filters having a bandwidth of more than 20% that have big losses. This is true for all SAW filters using Raleigh waves. A greater bandwidth yields a greater loss for a given coupling. A higher coupling yields a lower loss for a given bandwidth.

SUMMARY OF THE INVENTION

Embodiments of the invention provide large bandwidth filters that are less expensive than ceramic filters and that do show only small losses, e.g., a small insertion loss in their passband.

The inventors found out that transducers working with SAW waves of the type PSAW (PSAW=pseudo SAW) are promising candidates for building a broadband filter there from thereby solving the problem.

The invention provides a SAW filter working with acoustic waves of the PSAW type and comprises a piezoelectric substrate that is chosen to propagates a PSAW. A least a first transducer is arranged on the substrate that comprises a multitude of cells with a respective electrode finger combination. The cells are arranged after one another in a longitudinal direction being the propagation direction of the SAW, at least part of the cells are SPUDT cells. The large relative bandwidth of the transducer is realized by choosing a fan-type or fan shaped transducer. Such a transducer comprises a given pattern of electrode fingers, wherein the distances between the centers of each pair of transducer fingers enhances in a transversal direction. Thereby the width of a transducer finger and each spacing between the fingers of a respective pair of adjacent transducer fingers are commonly enhancing to the same extend. Hence, the finger pattern is scaled up in a transversal direction. But it is possible too to keep one of these parameters constant while enhancing the other disproportionally. This enhancement can thus be made by scaling the distance only or the width only. Enhancing both parameters asymmetrically is possible too. Advantageously dimensional scaling of the finger pattern is selected to reach a large relative bandwidth of the transducer of at least 8% and up to 50% and more.

Acoustic waves of the PSAW type are well known in the art. They can propagate on a substrate having a cut that is chosen to support the generation of PSAWs. Preferred piezoelectric substrates are chosen from a piezoelectric material that has a high coupling. The inventors found out that two specific cuts of different piezoelectric materials are advantageous for this purpose. Lithium niobate with a rotated Y-cut of 41° (LN41rotY). Another preferred substrate is lithium tantalite with a rotated XY cut of 36° (LT36rotXY). Beside these cuts optimized for high coupling of PSAWs and low propagation loss other materials with cut angles are possible that vary around the above given value. Variations of ±30° for LN and of ±5° for LT provide reasonable trade-offs for resulting in a substrate material having higher PSAW coupling but at the same time a lower propagation loss.

When compared to LT, LN shows a large cut angle range which is optimal for high coupling of PSAWs and low propagation loss at low metallization height.

Filters comprising fan-shaped transducers need a structure comprising SPUDT cells. Preferred SPUDT cells for creating the inventive broad bandwidth filter are chosen from the type Hanma Hunsinger and Feudt. These SPUDT cell types are preferred because they show a relative low reflectivity compared to cells having two electrode fingers per wavelength that could have too much reflection for compensation of triple transit signals. The preferred SPUDT cell types have a structure of at least four electrode fingers per wavelength and a reflection of about 1-2%. The cells are optimized to generate PSAW and to minimize the effect of still generating and propagating Raleigh waves.

According to an embodiment of the invention the transducer has a relative metallization height (relative to the wavelength) that is chosen to minimize the propagation loss and to yield a reflection coefficient for the four-finger-cell of, for example, between 1 and 3% and to suppress Raleigh waves that are unwanted in this case.

In an embodiment using LN41rotY as substrate material of the filter an optimum in view of propagation loss and reflection coefficient corresponds to a relative metallization height that is between 1 and 3%.

A transducer is used for transducing an electric RF signal into an acoustic wave and vice versa. The relative bandwidth of such a transducer is dependent on the range of wavelengths that are transduced with high effectivity, i.e., with low attenuation. By using a piezoelectric substrate having a cut showing a large coupling for PSAWs, using a cell type and a relative metallization height having low reflection, providing a high metallization ratio to limit the propagation loss, it is possible to produce transducers having a relative bandwidth of up to 50% and more.

A filter according to the present invention can comprise a second fan-shaped transducer. First and second transducers are arranged along a longitudinal direction within the same acoustic track. A shielding structure is arranged between the first and second transducers that comprises a fully metalized area or a non-reflective finger grating that is adapted to minimize the free propagation area between the transducers and the shielding structure thereby minimizing the propagation loss of the PAW that would result from a free surface area.

The shielding structure covers a trapezoid area, the width of which is enhancing in a traversal direction opposite to the width enhancement of the transducer electrode fingers. The second transducer may be a normal finger transducer but fan-type transducers are most preferred for the second transducer.

Both transducers of the filter comprise SPUDT cells wherein the unidirectionality of the second transducer is opposite to the unidirectionality of the first transducer. The second transducer has the same bandwidth like the first transducer. In a preferred embodiment the second transducer has a structure that is horizontally flipped in view of the structure of the first transducer. By the unidirectionality of the two transducers only a very low degree of waves can leave the acoustic track in a longitudinal direction. These unwanted waves that can produce detrimental signals can be absorbed by arranging a damping mass at both ends of the acoustic track. The damping mass is arranged over the whole aperture of the acoustic track, that is over the whole extent of the electrode finger overlap along the transversal direction. The damping structure comprises a damping mass that is preferably a resin having matched acoustic properties that the PSAW may easily enter into the damping mass where it is absorbed by non-elastic deflection or oscillation.

The shielding structure is useful for compensating different delay times that occur because of the varying finger width and finger spacings. The most preferable structure of the shielding structure totally compensates lower delay time in each of the two transducers by providing a respectively higher delay time inside the shielding structure. The delay time within an acoustic path comprising a metalized area that may be completely metalized or have a finger grating is dependent on the metallization ratio that rules the propagation velocity of the acoustic wave. The higher the metallization ratio, the lower is the acoustic velocity. As far as the shielding structure is realized by a finger grating the fingers of the shielding structure are electrically shorted for avoiding excitement of acoustic waves or out-coupling of these waves.

A fan-type transducer has a large bandwidth because it comprises a multitude of parallel channels, each channel having a respective middle frequency that is different for all channels. Within a channel all finger width and/or finger spacings may be constant. In such an embodiment the fan structure has a stepped structure. In a stepped structure having n different channels n may be selected as an integer with $5<n<50$.

But it is possible too that the fan-type transducer has a continuous structure whose fragmentation into different channels is only virtual. Such a virtual channel may be defined by a given bandwidth of the channel. A desired bandwidth of a channel is selected by selecting a transversal section that is defined by the according amount of finger width variation within this section.

BRIEF DESCRIPTION OF THE DRAWINGS

A more detailed description of the invention can be taken from the embodiments which are illustrated by the accompanied drawings. The drawings are drawn schematically only and are thus not to scale. Specific details may be depicted enlarged for better understanding.

FIG. 1 shows a part of an electrode pattern of a first embodiment;

FIG. 2 shows an arrangement of an absorber, a first transducer, a shielding structure and a further acoustic absorber within an acoustic track;

DETAILED DESCRIPTION OF ILLUSTRATIVE EMBODIMENTS

FIG. 1 shows a section of an electrode finger pattern of a fan shaped transducer FT of a first embodiment. Depicted is a section of the transducer area near a busbar BB. The transducer comprises a lot of cells, the number of which is chosen according to the desired transfer function between 25 and 150. The cells have a length in the longitudinal direction along the x axis of, e.g., one wavelength λ and is preferably the same in all cells. The cells are chosen from the group split finger cells with four fingers, SPUDT cells with at least four fingers of the type Hanma Hunsinger, SPUDT cells with at least four fingers of the type Feudt and cells that do not reflect nor excite an acoustic wave. In the embodiment, a Hanma Hunsinger SPUDT cell UTC with four SPUDT fingers UTF is arranged between two split finger cells SFC with four split fingers SF per cell. Number and sequence of different cells are optimized for best performance in view of passband behavior and rejection.

The transducer is fan shaped such that the width of the fingers and/or the distances there between are enhancing in the transversal direction that is along the y-axis. The dotted lines indicate that the transducer extends beyond the depicted section. By enhancing the dimensions in transversal direction the wavelength of the excited SAW (PSAW) enhances at the same time. By dividing the transducer FT in the transversal direction into channels of a given bandwidth and a middle frequency the total transducer FT has a bandwidth reaching from the middle frequency of the first channel with the lowest wavelength to the middle frequency of the opposite channel having the largest bandwidth.

FIG. 2 shows a filter arrangement with two fan shaped transducers FT1 and FT2 and a shielding structure SH arranged between. The first transducer FT1 may be an input transducer of the filter while the second transducer may be the output transducer. The transducers may have the same finger pattern but in a finger sequence that is mirrored relative to each other. Both transducers have increasing dimensions in the y-direction and are thus of a trapezoid shape. The shielding structure SH has a trapezoid shape too but its dimensions are decreasing in the y-direction. At both ends of the filter in the longitudinal direction an absorber ABS is arranged respectively.

Figure 3A:
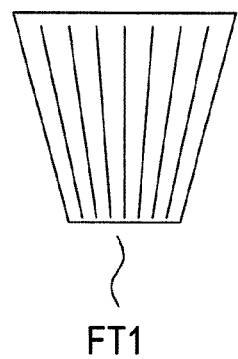
FIG. 3A shows the widening of electrode finger within a transducer.

FIG. 3A schematically shows the increasing dimensions of the finger pattern in a fan shaped transducer FT.

Figure 3B:
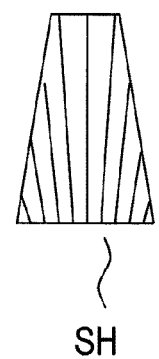
FIG. 3B shows a finger grating within a shielding structure.

FIG. 3B schematically shows a finger grating that may be used for the shielding structure SH to compensate the different delay times in the different channels of the filter produced by the fan structure. As shown in the figure, the finger grating of the shielding structure SH may be increasing as well. For achieving a good compensation of differences in the delay times the shielding structure may comprise a fully metalized area such that the delay time is dependent only on the length of the metalized area in a respective channel. Thereby the shape of the metalized area of the shielding structure SH may deviate in the inclining angle.

The shielding structure is further designed to minimize propagation loss on a surface free of metal where otherwise high losses have to be expected. In an embodiment the gap between shielding structure and transducer is about the same as the gap between adjacent electrode fingers in the transducer.

For a specific filter embodiment a filter is manufactured having a cell type structure similar to the finger pattern shown in FIG. 1 but comprising SPUDT cells of the FEUDT type too. A lithium tantalate substrate is chosen having a cut angle LT36rotYX. The metallization mainly comprised of Al is applied with a thickness of 350 nm. The filter can be mounted within a package having small dimensions like 7 mm×5 mm.

Despite a medium coupling (5%) of the PSAW into the LT36rotYX substrate material the filter shows a low loss behavior and a passband having a width of 10% and a temperature coefficient of frequency that is 3 times smaller than the respective TCF of a filter made on a LNYZ material having a higher coupling for Raleigh waves.

This allows specifying a more soft transition between passband and stopband.

Figure 4:
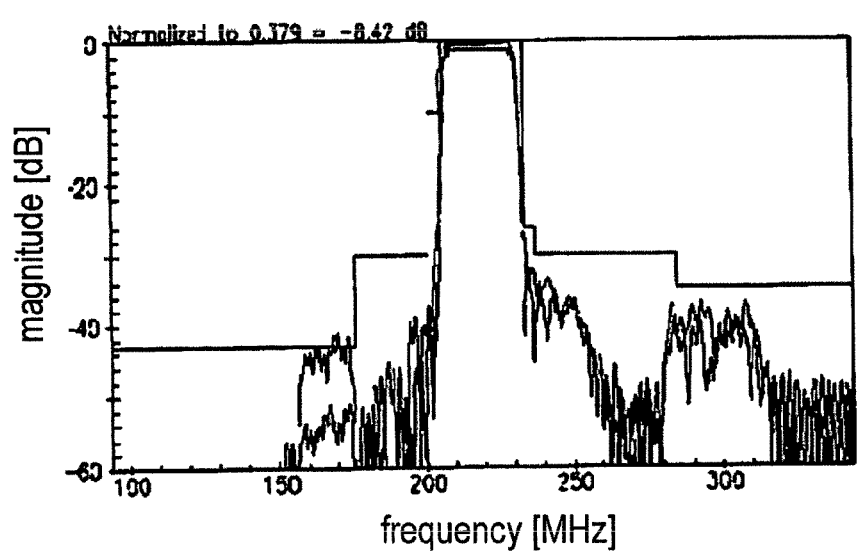
FIG. 4 shows the transfer functions of two filters built on LT36rotXY: A first curve relates to a filter with cells optimized for minimal Raleigh wave propagation, and a second one to filters without this optimization.

FIG. 4A depicts the measured transfer function S21 that shows a passband between 205 and 225 MHz.

For a second specific filter embodiment a filter is manufactured having a cell type structure similar to the finger pattern shown in FIG. 1 using only Hanma Hunsinger cells as SPUDZ cells. A lithium niobate substrate is chosen having a cut angle LN41RY. The metallization mainly comprised of Al is applied with a thickness of 470 nm. This filter too can be mounted within a package having small dimensions like 7 mm×5 mm.

Figure 5A:
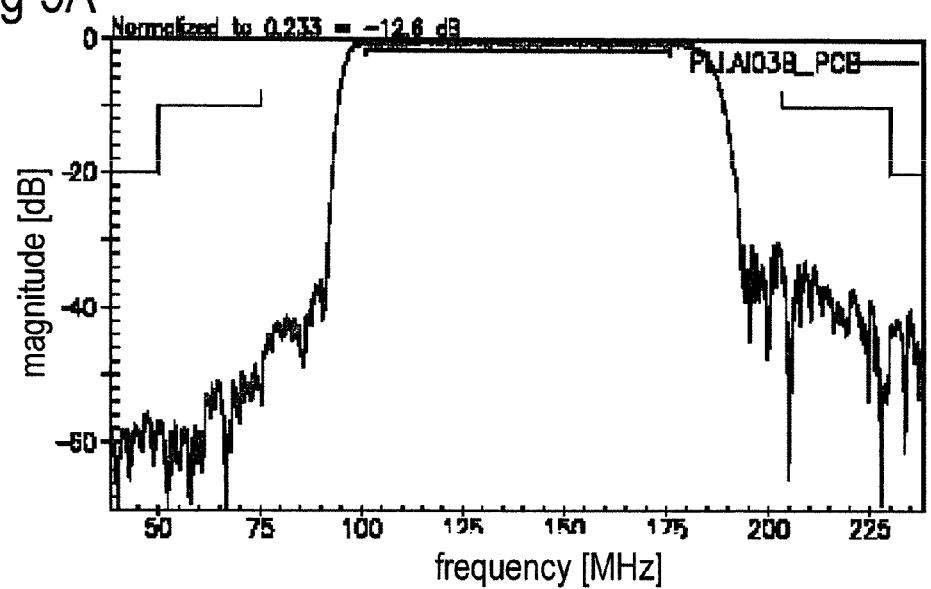
FIG. 5A shows the transfer function of a filter built on LN41rotY showing a relative bandwidth of 55%.
Figure 5B:
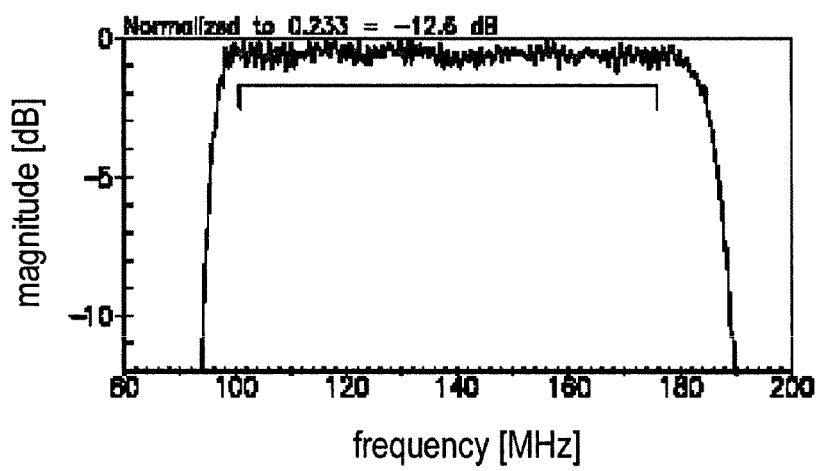
FIG. 5B shows a pass band of the same transfer function.
Figure 5C:
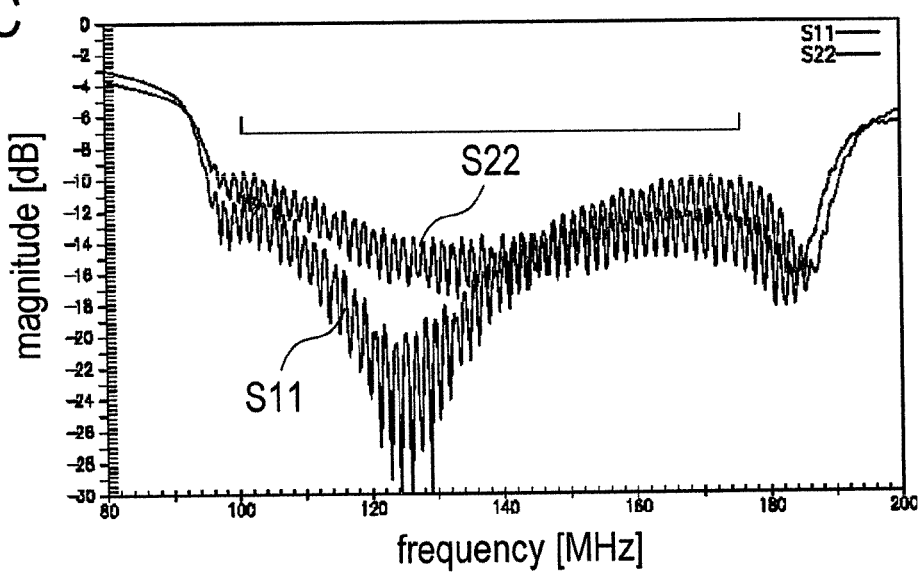
FIG. 5C shows the input return loss of the same filter embodiment.

FIGS. 5A and 5B depict the measured transfer functions S21 that show a passband between 100 MHz to 175 MHz according to a relative bandwidth of 55%. The respective functions S11 and S22 are shown in FIG. 5C.

On this substrate and with the chosen metallization a coupling of the PSAW is achieved of 11%. Hence, a very broad bandwidth of 55% is achieved with this filter that is a record breaking value for SAW filters. The insertion loss is about −13 dB. Nevertheless, the skirts of the passband are steep enough and in the lower stop band an attenuation of more than 40 dB achieved. In the higher stop band the attenuation reaches 35 dB.

Moreover the temperature coefficient for LN41rotY is only −64 ppm/° C. that is smaller than its Raleigh counterpart (−87 ppm/° C.) build on a LNYZ substrate material allowing more margin for transition.

A more exact illustration of the pass band with an enlarged y-axis is given by FIG. 5B. It shows that the filter has low amplitude ripple variation of 1.5 dB only. Further, the S11 and S22 parameters of the filter are given in FIG. 5C and present a return loss of more than −9 dB.

Figure 6:
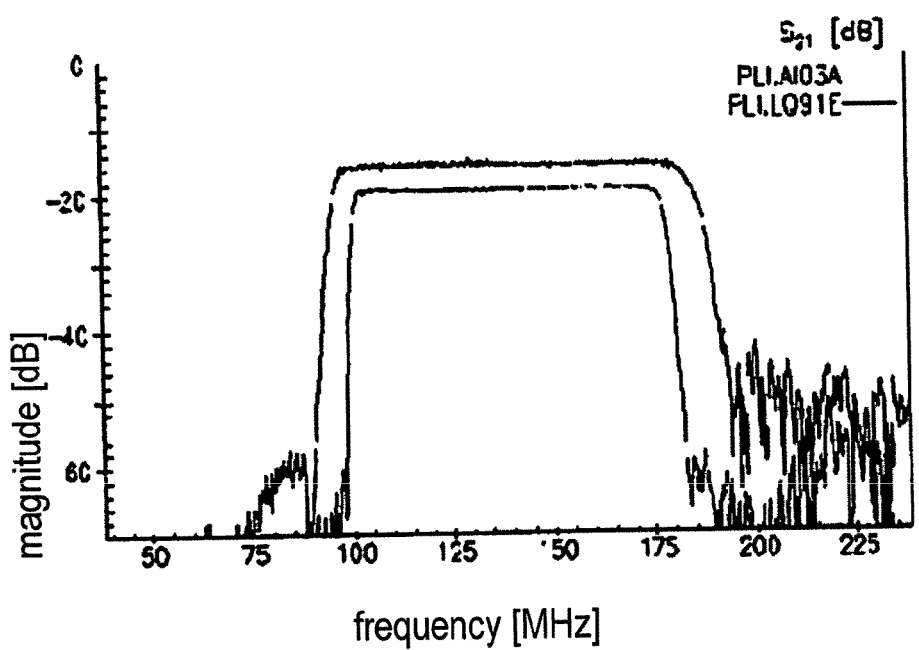
FIG. 6 is a comparison of two transfer functions S21 of the new filter built on LN41RY with a second filter built on LNYZ.

FIG. 6 is a comparison of two transfer functions S21 of the new filter built in LN41rotY of the second specific embodiment (upper curve) and a state of the art filter constructed as a fan type filter built in LNYZ using Raleigh waves on a Raleigh substrate (lower curve). From the figure the advantages of the new filter and its outstanding broad bandwidth become clear. The new filter is further improved in insertion loss.

The comparison between S21 measurement of a filter built on LN41RY (upper curve) and a filter build on LNYZ (lower curve) with nearly the same relative bandwidth. The filter built on LN41RY shows a lower insertion loss and has steeper skirts.

Figure 7A:
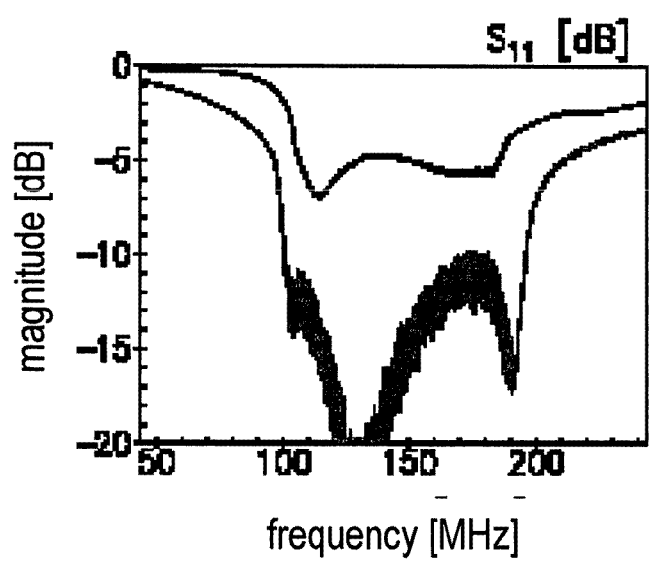
FIGS. 7A and 7B each show a comparison between S11 and S22 measurement of a filter builds on LN41RY and a filter builds on LNYZ with the same relative bandwidth.
Figure 7B:
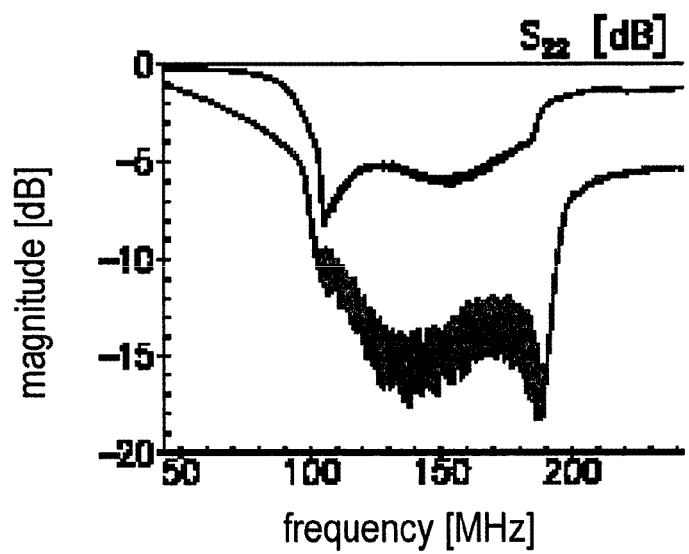

FIGS. 7A and 7B show a comparison between S11 (FIG. 7A) and S22 (FIG. 7B) measurement of a filters built on LN41RY (upper curve) and a filters builds on LNYZ (lower curve) with same relative bandwidth.

The following table shows the measured data for these filters.

|  | Filter on LYZ Rayleigh wave (typical value) | Filter on LN41RY PSAW (typical value) |
| --- | --- | --- |
| Relative bandwidth | 50% | 55% |
| Insertion loss | 19.5 dB | 13 dB |
| Input return loss | 4.5 dB | 9.5 dB |
| Output return loss | 4.5 dB | 9.5 dB |
| TCF | −87 ppm/k | −64 ppm/K |

Most reasonable is the low TCF (temperature coefficient of frequency) of the new material LN41RY being lower than the TCF of LNYZ using Raleigh waves. This allows specifying a more soft transition between passband and stopband which is easier to achieve.

Figure 8:
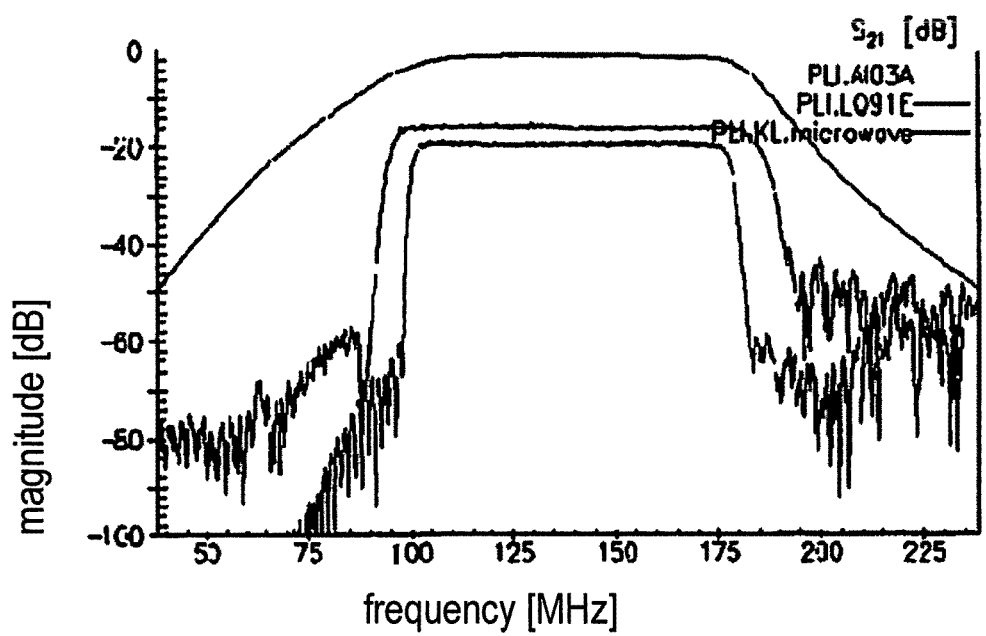
FIG. 8 shows the same comparison like FIG. 6 but further comprising the S21 transfer function of state of the art filters realized as ceramic filter.

FIG. 8 shows the same comparison like FIG. 6 but further comprising the S21 transfer function of state of the art filters realized as ceramic filter. It is striking that almost the same bandwidth can be reached whereas the skirts of the passband and the stop band attenuation of the new filter is clearly improved showing the superiority of the new filter over prior art filters.

The invention shall not be limited by the specific embodiments and according to the figures but shall only defined by the claims and the respective description as given above.

The invention claimed is:

1. A filter working with acoustic waves of the pseudo surface acoustic wave (PSAW) type comprising:
   a piezoelectric substrate chosen to propagate a PSAW; and
   a first transducer arranged on the substrate and comprising a plurality of cells with a respective electrode finger combination, the cells being arranged after one another in a longitudinal direction, at least some of the cells being SPUDT cells;
   wherein the transducer is a fan type transducer, where a width of each transducer finger and a spacing between the fingers of a respective pair of adjacent transducer fingers are enhancing in a transversal direction; and
   wherein the fan type cells are adapted to provide a relative bandwidth of the transducer of at least 8%.

2. The filter of claim 1, wherein the SPUDT cells are Hanma Hunsinger or Feudt cells.

3. The filter of claim 1, wherein the substrate comprises a lithium niobate with a cut LN(41±30°)rotY.

4. The filter of claim 1, wherein the substrate comprises a lithium tantalate with a cut LT(36±5°)rotXY.

5. The filter of claim 1, wherein the transducer has a metallization ratio $\eta$ of at least 0.6.

6. The filter of claim 1, where the transducer has a relative metallization height of 1-4%.

7. The filter of claim 1, where the SPUDT cells comprise 4 fingers per wavelength $\lambda$.

8. The filter of claim 1, further comprising a second fan type transducer, both the first transducer and the second transducer being arranged along a longitudinal direction within the same acoustic track and comprising a shielding structure configured to lower free surface propagation between the first and the second transducer.

9. The filter of claim 8, wherein the shielding structure is a fully metalized area.

10. The filter of claim 8, wherein the filter comprises a non-reflective finger grating.

11. The filter of claim 8, wherein the shielding structure has a trapezoid area the width of which is enhancing in a transversal direction opposite to the width enhancement of the transducers.

12. The filter of claim 8, wherein the transducer comprises a number of n parallel channels extending along the longitudinal direction and the PSAW has a delay time that is the same in each channel, where n is an integer $5<n<50$.

13. The filter of claim 12, wherein each channel has a given transversal extent in the transversal direction and wherein the finger widths and finger spacing of the respective channel are constant along the transversal extent but are enhancing when turning to an adjoining channel.

14. The filter of claim 1, further comprising a damping structure on the surface of the substrate at longitudinal ends of the acoustic track.

15. The filter of claim 14, wherein the transducer comprises a number of n parallel channels extending along the longitudinal direction and the PSAW has a delay time that is the same in each channel, where n is an integer $5<n<50$.

16. The filter of claim 15, wherein each channel has a given transversal extent in the transversal direction and wherein the finger widths and finger spacing of the respective channel are constant along the transversal extent but are enhancing when turning to an adjoining channel.

* * * * *